(12) United States Patent
Kim

(10) Patent No.: US 8,232,594 B2
(45) Date of Patent: Jul. 31, 2012

(54) SEMICONDUCTOR DEVICE AND METHOD OF MANUFACTURING THE SAME

(75) Inventor: Hyun-Tae Kim, Bucheon-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 92 days.

(21) Appl. No.: 12/643,458

(22) Filed: Dec. 21, 2009

(65) Prior Publication Data

US 2010/0163980 A1    Jul. 1, 2010

(30) Foreign Application Priority Data

Dec. 30, 2008    (KR) .................. 10-2008-0137578

(51) Int. Cl.
*H01L 29/78* (2006.01)
*H01L 21/336* (2006.01)
*H01L 21/762* (2006.01)

(52) U.S. Cl. ......... 257/335; 257/E29.256; 257/E21.417; 257/E21.546; 438/297

(58) Field of Classification Search .................. 257/335, 257/E29.256, E21.417, E21.546; 438/297
See application file for complete search history.

(56) References Cited

U.S. PATENT DOCUMENTS

| 5,917,203 | A  | * | 6/1999 | Bhatnagar et al. | ............. 257/139 |
| 7,374,999 | B2 | * | 5/2008 | Ko | ................................. 438/294 |
| 7,683,427 | B2 | * | 3/2010 | Chen et al. | ..................... 257/343 |
| 2009/0159968 | A1 | * | 6/2009 | Merchant et al. | ............. 257/337 |

* cited by examiner

*Primary Examiner* — Eugene Lee
*Assistant Examiner* — Monica D Harrison
(74) *Attorney, Agent, or Firm* — Sherr & Vaughn, PLLC

(57) ABSTRACT

A semiconductor device includes an isolation layer formed on and/or over a semiconductor substrate to define an isolation layer, a drift area formed in an active area separated by the isolation layer, a pad nitride layer pattern formed in a form of a plate on the drift area, and a gate electrode having step difference between lateral sides thereof due to the pad nitride layer pattern.

14 Claims, 3 Drawing Sheets

SEMICONDUCTOR DEVICE AND METHOD OF MANUFACTURING THE SAME

The present application claims priority under 35 U.S.C. 119 to Korean Patent Application No. 10-2008-0137578 (filed on Dec. 30, 2008), which is hereby incorporated by reference in its entirety.

BACKGROUND

A BCDMOS device is a semiconductor device having a complex structure of three devices including a bipolar semiconductor device, a complementary metal oxide semiconductor (CMOS) device, and a depletion metal oxide semiconductor (DMOS) device. Such a BCDMOS device represents high-frequency and high-voltage characteristics of the bipolar semiconductor device, low-voltage and high-integration characteristics of the CMOS device, and a power control characteristic according to resistance between a source and a drain in the DMOS device.

A BCDMOS device may be equipped with a power supply device, a logic function, and a high-voltage/high-current power output function within a single chip. The BCDMOS employs a small chip and represents lower power consumption. The BCDMOS can be driven with a high current and a high withstanding voltage.

SUMMARY

Embodiments provide a method of manufacturing a semiconductor device. More particularly, embodiments provide a semiconductor device suitable for improving a device characteristic by enhancing a moat pattern process in the process of forming an isolation layer of a semiconductor device and a method of manufacturing a semiconductor device.

According to embodiments, a semiconductor device may include an isolation layer formed on and/or over a semiconductor substrate to define an isolation layer, a drift area formed in an active area separated by the isolation layer, a pad nitride layer pattern formed in a form of a plate on the drift area, and a gate electrode having step difference between lateral sides thereof due to the pad nitride layer pattern.

According to embodiments, a method of manufacturing a semiconductor device includes forming a trench for device isolation by etching a semiconductor substrate along a pad oxide layer and a pad nitride layer patterned on and/or over the semiconductor substrate, filling the trench with an insulating material, forming a moat pattern on and/or over both of the insulating material and a plate area, forming a pad nitride layer pattern having a plate form by removing the pad nitride layer from an area other than the moat pattern and the plate area, and forming a gate electrode having a step difference at both lateral sides thereof along the pad nitride layer pattern.

DRAWINGS

DESCRIPTION

Figure 1:
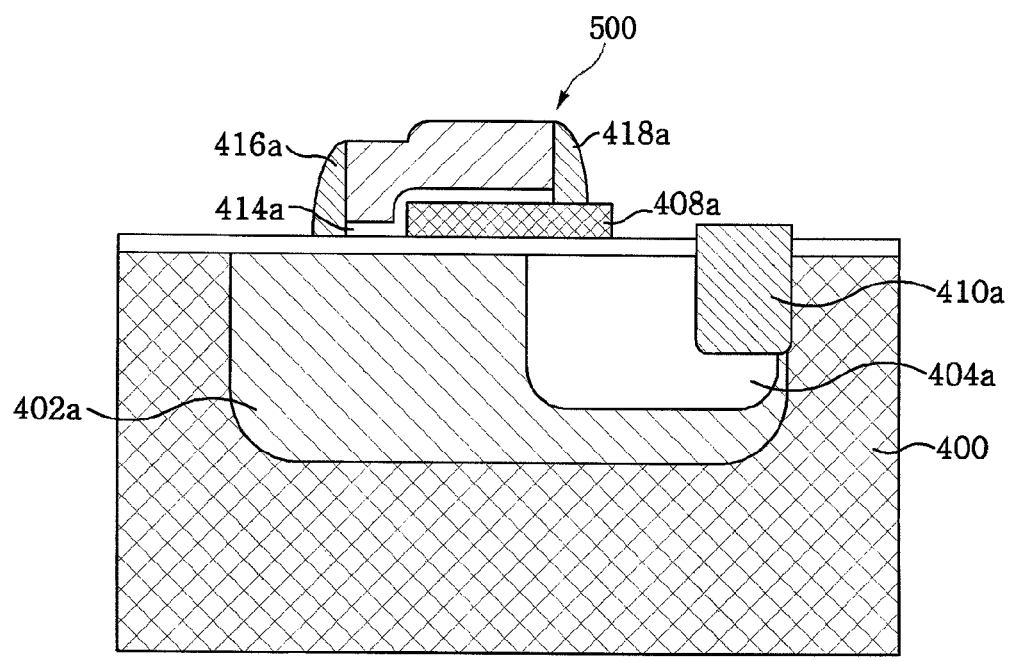
FIG. 1 is a sectional view showing a semiconductor device manufactured through a moat pattern process according to embodiments.

FIG. 1 is a sectional view showing a semiconductor device manufactured through a moat pattern process according to embodiments. Referring to FIG. 1, first conductive type deep wells 402a, 402b, and 402c may be formed corresponding to their respective device areas of a semiconductor substrate 40 having a first conductive type (e.g., P type) through an ion implantation process. Drift areas 404a, 404b, and 404c having a second conductive type (e.g., N type) may be formed corresponding to the first conductive type deep wells 402a, 402b, and 402c, respectively, through an ion implantation process, and an isolation layer 410a is formed in an isolation area. The drift areas 404a, 404b, and 404c may be formed in the first conductive type deep wells 402a, 402b, and 402c.

The isolation layer 410a may be formed by filling a trench for device isolation with an insulating material after the trench has been formed by using a pad oxide layer and a pad nitride layer patterned on the semiconductor substrate 400 as a hard mask. After the trench has been filled with the insulating material, the pad oxide layer and the pad nitride layer may be removed from the semiconductor substrate 400.

A gate electrode may be provided on the semiconductor substrate 400 having the first conductive type deep wells 402a, 402b, and 402c and the second conductive type drift areas 404a, 404b, and 404c. The gate electrode can include a pad nitride layer pattern 408a, a gate oxide layer 414a, a polysilicon layer 416a, and a spacer 418a. The pad nitride layer pattern 408a may, for example, be prepared in the form of a plate over one lower lateral side of the gate electrode. Step difference may be formed between the gate electrode and the pad nitride layer pattern 408a. One end of the pad nitride layer pattern 408a may be interposed between the semiconductor substrate 400 and the gate oxide layer 414a, and the other end of the pad nitride layer pattern 408a may be exposed to an exterior. The other end of the pad nitride layer pattern 408a exposed to the outside of the gate electrode may be provided on a drain drift area.

Also, a semiconductor device may be formed on one of device areas. And, a gate electrode having a poly plate structure may be formed by using a remaining pad nitride layer pattern of each device area. Accordingly, the pad nitride layer pattern 408a remaining in one lower lateral side of the gate electrode may be formed in the drain drift area, thereby improving resistance and voltage characteristics of the BCDMOS device.

Figure 2:
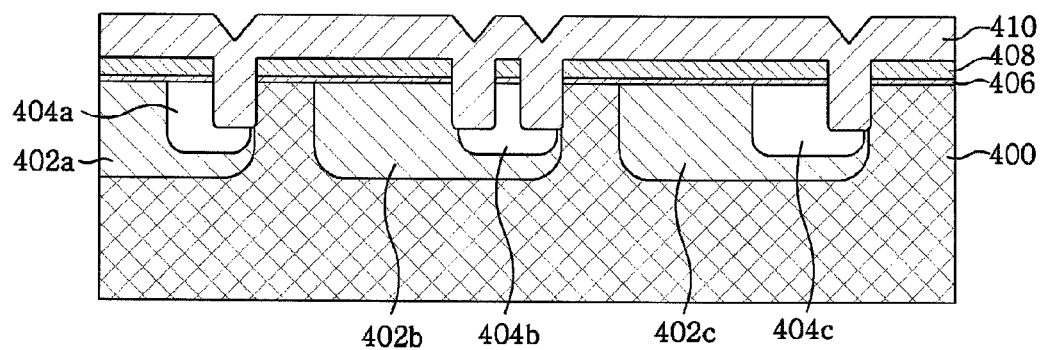
FIGS. 2 to 5 are sectional views showing a manufacturing process of a semiconductor device through the moat pattern process according to embodiments.

FIGS. 2 to 5 are sectional views showing a manufacturing process of a semiconductor device through the moat pattern process according to embodiments. As shown in FIG. 2, the first conductive type deep wells 402a, 402b, and 402c, the second conductive type drift areas 404a, 404b, and 404c, and an insulating material 410 are formed on and/or over the semiconductor substrate 400. The first conductive type deep wells 402a, 402b, and 402c may be formed by implanting first conductive type impurities (e.g., P type impurities) into the semiconductor substrate 400. The second conductive type drift areas 404a, 404b, and 404c may be formed in their respective first conductive type deep wells 402a, 402b, and 402c. The conductive type drift areas 404a, 404b, and 404c may be formed by implanting second conductive impurities (e.g., N type impurities).

A pad oxide layer 406 and a pad nitride layer 408 may be deposited on and/or over the semiconductor substrate 400 having the first conductive type deep wells 402a, 402b, and 402c and the second conductive type drift areas 404a, 404b, and 404c. Then, the resultant structure can be patterned. Next, the pad oxide layer 406 and the pad nitride layer 408 may be etched, for example, by using a hard mask, thereby forming a trench for device isolation. An insulating material 410 may be deposited to fill in the trench. For example, the insulating material 410 may cover substantially the entire portion of the semiconductor substrate 400 and substantially the entire internal portion of the trench may be filled with the insulating material 410.

Figure 3:
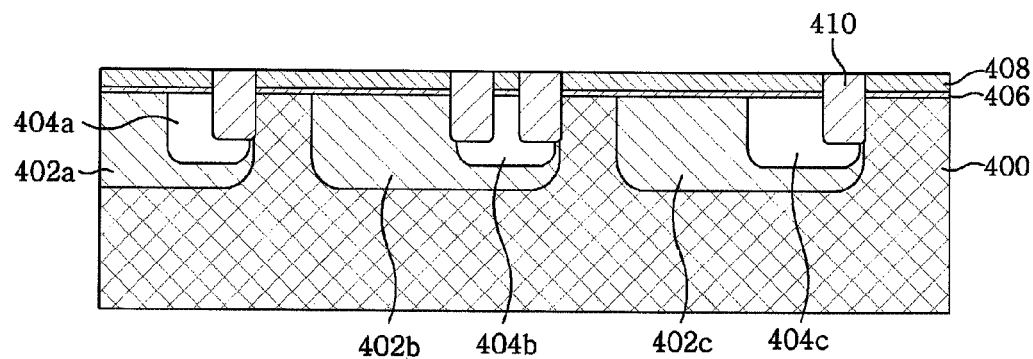

Then, as shown in FIG. 3, a chemical mechanical polishing (CMP) process may be performed with respect to the semiconductor substrate 400 provided thereon with the insulating material 410, thereby exposing the pad nitride layer 408. In other words, the pad nitride layer 408 may serve as a stop layer in the CMP process. The insulating material 410 may be removed from an upper portion of the pad nitride layer 408 through the CMP process in such a manner that the insulating material remains substantially only in the trench.

Figure 4:
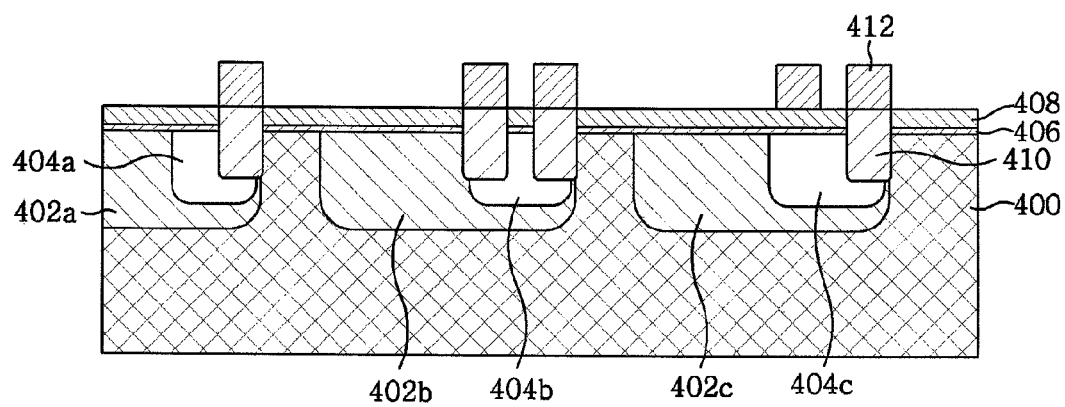

Thereafter, as shown in FIG. 4, a moat pattern 412 may be formed on and/or over the semiconductor substrate 400. The moat pattern 412 may be formed by patterning an insulating material after the insulating material has been deposited on and/or over the semiconductor substrate 400 having the pad nitride layer 408 that has been exposed. For example, the moat pattern 412 may be formed in both of an area corresponding to the insulating material 410 remaining in the trench and an area in which a gate is formed in the subsequent process. In other words, the moat pattern 412 may be formed in the area in which a gate is formed in the subsequent process.

Figure 5:
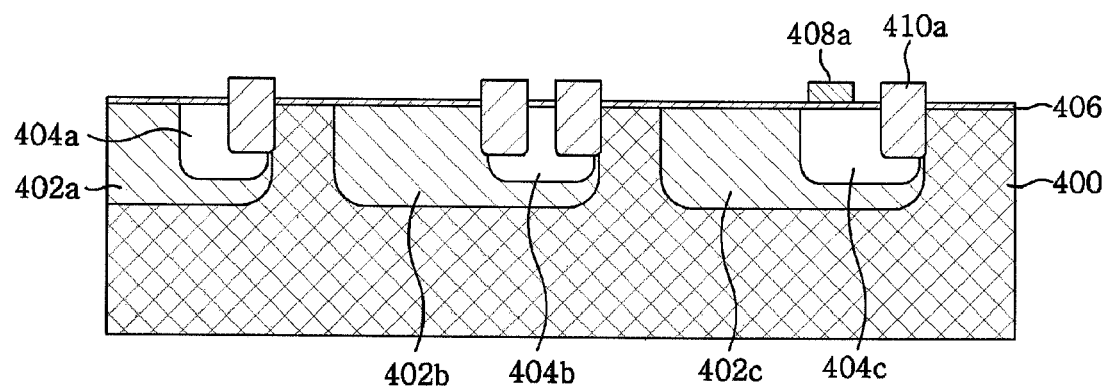

Then, as shown in FIG. 5, the semiconductor substrate 400 may be etched by using the moat pattern 412 as a mask, thereby forming the pad nitride layer pattern 408*a*. The etch process may be an etch back process performed with respect to the upper portion of the semiconductor substrate 400 having the moat pattern 412. Next, the pad nitride layer 408 may be removed from the upper portion of the semiconductor substrate 400 through the etch process, and the pad nitride layer pattern 408*a* can be formed substantially only in the gate area. For example, the pad nitride layer pattern 408*a* may be prepared in the form of a plate at a lower portion of a gate that will be formed later.

Thereafter, gate electrodes may be formed in areas in which a bipolar device, a CMOS device, and a DMOS device are defined. Due to the pad nitride layer pattern 408*a*, the gate oxide layer, the polysilicon layer and the spacer formed at one side of the gate electrode may have step difference different from that of the gate oxide layer, the polysilicon layer and the spacer formed at the other side of the gate electrode.

Although embodiments have been described with a pad nitride layer pattern 408*a* formed only at the third area (the first area from a right side of FIG. 5) of three device areas, another pad nitride layer pattern may be formed in another area according to a moat pattern after the moat pattern has been formed in a desired area. Accordingly, a pad nitride layer pattern remaining at one lower lateral side of a gate electrode may be formed at a drain drift area, thereby improving resistance and voltage characteristics of the BCDMOS device.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:
1. A semiconductor device comprising:
an isolation layer formed over a semiconductor substrate;
a drift area formed in an active area separated by the isolation layer;
a pad nitride layer pattern formed in a form of a plate on the drift area;
a gate electrode having step difference between lateral sides thereof due to the pad nitride layer pattern such that only one side of the gate electrode is formed over the pad nitride layer pattern; and
a first conductive type deep well formed in the semiconductor substrate, wherein the isolation layer contacts the first conductive type deep well and the drift area,
wherein the pad nitride layer pattern has one end interposed between the gate electrode and the semiconductor substrate,
wherein the pad nitride layer pattern has an opposite end exposed to an outside of the gate electrode,
wherein the opposite end of the pad nitride layer pattern exposed to the outside of the gate electrode is provided on the drift area,
wherein the drift area is formed in the first conductive type deep well.

2. A semiconductor device comprising:
an isolation layer formed over a semiconductor substrate;
a drift area formed in an active area separated by the isolation layer;
a pad nitride layer pattern formed in a form of a plate on the drift area;
a gate electrode having step difference between lateral sides thereof due to the pad nitride layer pattern such that only one side of the gate electrode is formed over the pad nitride layer pattern; and
a first conductive type deep well formed in the semiconductor substrate,
wherein the isolation layer contacts the first conductive type deep well and the drift area,
wherein the gate electrode includes a gate oxide layer, a polysilicon layer, and spacers, and a portion of the gate oxide layer makes contact with the semiconductor substrate.

3. The device of claim 2, wherein the gate oxide layer, the polysilicon layer and the spacer formed at one side of the gate electrode have step difference different from step difference of the gate oxide layer, the polysilicon layer and the spacer formed at an opposite side of the gate electrode according to the pad nitride layer pattern.

4. A method comprising:
forming a trench for device isolation by etching a semiconductor substrate along a pad oxide layer and a pad nitride layer patterned on the semiconductor substrate;
filling the trench with an insulating material;
forming a moat pattern over both of the insulating material and a plate area in which a gate is formed in a subsequent process;
forming a pad nitride layer pattern having a plate form by removing the pad nitride layer from an area other than the moat pattern and the plate area; and then
forming a gate electrode having a step difference at both lateral sides thereof along the pad nitride layer pattern.

5. The method of claim 4, comprising:
forming a first conductive type deep well in the semiconductor substrate; and
forming a drift area in the first conductive type deep well, before the trench is formed.

6. The method of claim 5, wherein the pad nitride layer pattern has one end interposed between the gate electrode and the semiconductor substrate.

7. The method of claim 6, wherein the pad nitride layer pattern has an opposite end exposed to an outside of the gate electrode.

8. The method of claim 7, wherein the opposite end of the pad nitride layer pattern exposed to the outside of the gate electrode is provided over the drift area.

9. The method of claim 4, wherein the gate electrode includes a gate oxide layer, a polysilicon layer, and spacers, and a portion of the gate oxide layer makes contact with the semiconductor substrate.

10. The method of claim 9, wherein the gate oxide layer, the polysilicon layer, and the spacer formed at one side of the gate electrode have step difference different from step difference of the gate oxide layer, the polysilicon layer, and the spacer formed at an opposite side of the gate electrode according to the pad nitride layer pattern.

11. The method of claim 4, wherein the moat pattern is formed on both of the insulating material and the plate area.

12. The method of claim 4, wherein the pad nitride layer pattern has one end interposed between the gate electrode and the semiconductor substrate.

13. The method of claim 12, wherein the pad nitride layer pattern has an opposite end exposed to an outside of the gate electrode.

14. The method of claim 13, wherein the opposite end of the pad nitride layer pattern exposed to the outside of the gate electrode is provided over a drift area in the first conductive type deep well, the drift area being formed before the trench is formed.

* * * * *